(12) United States Patent
Landolt (10) Patent No.: US 7,528,757 B2
(45) Date of Patent: May 5, 2009

(54) CIRCUIT AND METHOD FOR GENERATING A SET OF INTERMEDIATE VOLTAGES

(75) Inventor: Oliver Landolt, Taufkirchen (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 0 days.

(21) Appl. No.: 11/871,912

(22) Filed: Oct. 12, 2007

(65) Prior Publication Data

US 2008/0111726 A1 May 15, 2008

(30) Foreign Application Priority Data

Nov. 13, 2006 (EP) ................... 06023565
Mar. 13, 2007 (EP) ................... 07005176

(51) Int. Cl.
*H30M 1/34* (2006.01)

(52) U.S. Cl. .............. 341/158; 341/159; 341/120; 341/118; 341/119

(58) Field of Classification Search ............. 341/158, 341/159, 120, 118, 119
See application file for complete search history.

(56) References Cited

U.S. PATENT DOCUMENTS

| | | | |
|---|---|---|---|
| 4,929,848 A | 5/1990 | Gulczynski | |
| 6,255,979 B1 * | 7/2001 | Allee et al. | 341/159 |
| 6,373,423 B1 | 4/2002 | Knudsen | |
| 6,459,394 B1 * | 10/2002 | Nadi et al. | 341/120 |
| 6,756,699 B2 * | 6/2004 | Hartmann et al. | 307/106 |
| 6,972,701 B2 * | 12/2005 | Jansson | 341/120 |
| 7,106,230 B2 * | 9/2006 | Kushner et al. | 341/120 |
| 7,161,523 B1 | 1/2007 | Zortea | |
| 2005/0168370 A1 | 8/2005 | Mokhtari et al. | |

FOREIGN PATENT DOCUMENTS

| | | |
|---|---|---|
| WO | WO-99/13583 | 3/1999 |
| WO | WO-02/082660 | 10/2002 |

OTHER PUBLICATIONS

European Search Report dated Jun. 28, 2007.

* cited by examiner

*Primary Examiner*—Jean B Jeanglaude
(74) *Attorney, Agent, or Firm*—Marshall, Gerstein & Borun LLP (57) ABSTRACT

A network for generating a set of intermediate voltages comprising two input ports for feeding two reference voltages. The intermediate voltages are generated by a number of self calibration units that correspond to the number of intermediate voltages to be generated. Each self calibration unit receives the voltages of the neighboring calibration units or the voltage of one neighboring calibration unit and one of the reference voltages.

22 Claims, 5 Drawing Sheets

Fig. 1
(State of the Art)

CIRCUIT AND METHOD FOR GENERATING A SET OF INTERMEDIATE VOLTAGES

BACKGROUND OF THE INVENTION

1. Field of the Invention

The invention relates to a circuit and a method for generating a set of, for example, linearly or logarithmically spaced intermediate voltages as needed for analog-to-digital conversion, particularly with flash ADC converters.

2. Related Technology

Several types of analog-to-digital converters (ADC), notably flash and folding converters, operate by comparing an input voltage with a set of reference voltages uniformly distributed over the input signal full scale. The accuracy of these reference voltages is a key factor determining the linearity of the ADC. The present disclosure describes how a set of linearly spaced voltages can be produced as the collective result of an array of interacting self-calibration units. The invention lends itself well to a high-accuracy implementation ensuring linear spacing without resorting to calibration on an external reference. With a minor change in the design of the self-calibration unit, the array can also produce logarithmically spaced reference voltages.

Figure 1:
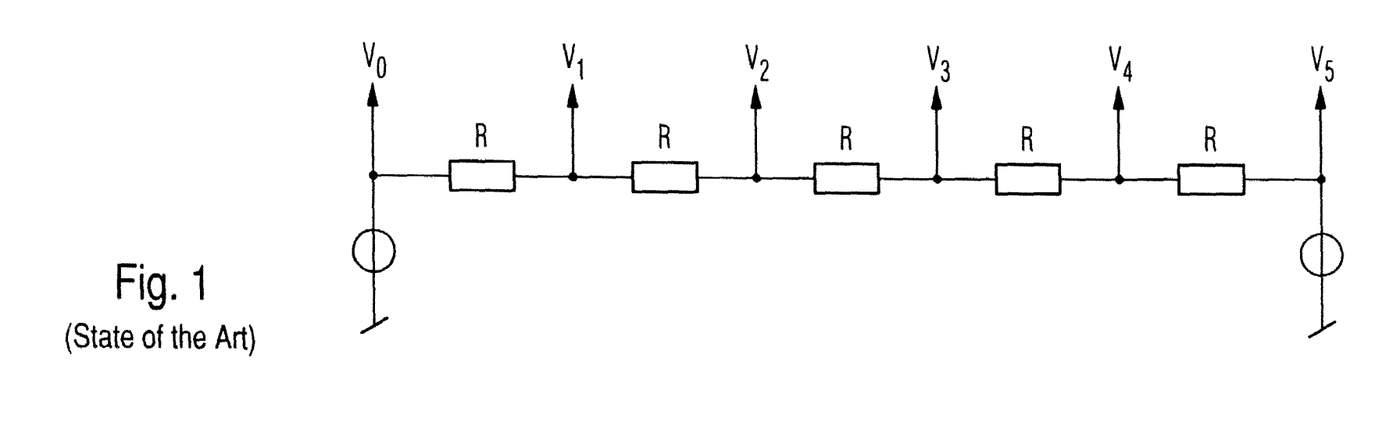
FIG. 1 shows a prior art circuit using a resistor chain to produce four linearly spaced reference voltages between two boundary voltages.

By far the most common way to generate a set of linearly spaced voltages consists of using a chain of identical resistors as shown, for example, in U.S. Pat. No. 6,437,724 B1. When the smallest desired voltage is applied to one end of the chain and the largest desired voltage is applied to the other end, intermediate taps in the chain settle to intermediate voltages with uniform spacing. This is illustrated in FIG. 1.

This approach, while sufficient for many applications, suffers from some drawbacks:

Accuracy is limited by resistor matching. Up to a point, matching can be improved by increasing the geometrical size of each resistor, but for highest accuracy, calibration becomes necessary.

When a current is drawn from the taps of the resistor chain—such as input bias currents of comparators for instance—the tap voltages are no longer uniformly spaced. In order to reduce the impact of such parasitic currents, it is generally necessary to choose very small resistor values, which results in a large power dissipation in the resistor chain.

The output impedance is not the same for all taps of the resistor chain. This drawback is significant in the case of fully differential ADC architectures, where the voltage boundaries are not constant but consist of the input signal of the ADC. At high frequencies, different taps will have different bandwidths and group delays, which creates distortion.

SUMMARY OF THE INVENTION

The invention provides a circuit and a method for generating a set of spaced voltages wherein the voltages are not dependent on properties of electrical devices, power dissipation is minimized, and well defined and constant output characteristics are guaranteed.

The invention provides a circuit and a method for generating a set of intermediate voltages.

According to the invention the circuit for generating a set of intermediate voltages includes two input ports for feeding two reference voltages, wherein the intermediate voltages are generated by a number of self calibration units that correspond to the number of intermediate voltages to be generated, wherein each self calibration unit receives the voltages of the neighboring calibration units or the voltage of one neighboring calibration unit and one of the reference voltages.

In a preferred embodiment, each self calibration unit includes an error amplifier network or circuit for providing an error voltage, a comparator for providing an up/down signal when the error voltage exceeds a positive or a negative voltage level, an up/down counter serving as an integrator and counting an internal count one up or one down depending on the up/down signal received from the comparator, an digital-analog-converter for converting the digital signal received from the up/down counter into an analog signal, and a clock signal generator for providing clock signals for the switches and the up/down counter.

In particular, the error amplifier network or circuit preferably includes a first capacitor which receives an output voltage $V_k$ of the self-calibration unit via a first switch and receives the output voltage $V_{k-1}$ of a first neighboring self-calibration unit via a second switch, a second capacitor which receives an output voltage $V_k$ of the self-calibration unit via a third switch and the output voltage $V_{k+1}$ of a second neighboring self-calibration unit via a fourth switch, an operational amplifier wherein the first and second capacitor are connected to its negative input port and its positive input port is connected to earth potential, moreover, a feedback capacitor which is connected with one terminal to the negative input port of the operational amplifier and with the other terminal to the output port of the operational amplifier.

In a preferred embodiment, each capacitor can be switched alternatively towards the $V_{k+1}$ input and the $V_{k-1}$ input instead of always going to the same input. Thus, on the average, the amplifier network or circuit will have the same gain for both inputs even if the two capacitors do not have exactly the same value.

In another preferred embodiment, each self-calibration unit tends to make $V_{k+1}-V_k$ twice as large as $V_k-V_{k-1}$. Then, the result of an array of such units is a set of voltage differences in geometric progression with a radix of two.

In the general case, the self-calibration units are preferably designed in such a way so that for the voltage differences the following equation is satisfied:

$$\alpha \cdot (V_{k+1}-V_k) = (1-\alpha) \cdot (V_k-V_{k-1}), \ 0 < \alpha < 1.$$

When $\alpha = \frac{1}{2}$, such a self-calibration will produce linearly spaced voltages. When $\alpha = \frac{1}{3}$, it produces voltages in a geometric progression with a radix of 2. When $\alpha = 1/(1+N)$, the radix of the geometric progression is N.

In one alternative embodiment, the self-calibration units are chained to a binary tree, wherein one unit takes two boundary voltages as inputs and produces a first middle voltage and two other units determine the middle point between one boundary voltage and the first middle voltage and the middle point between the first middle voltage and the other boundary voltage. Thus, adding layer after layer of additional units can be added to find the middle points within the set of voltages produced by previous layers generating a binary tree of voltages.

BRIEF DESCRIPTION OF THE DRAWINGS

Embodiments of the invention will now be described in more detail with reference to the drawings. In the drawings.

DETAILED DESCRIPTION

Figure 2:
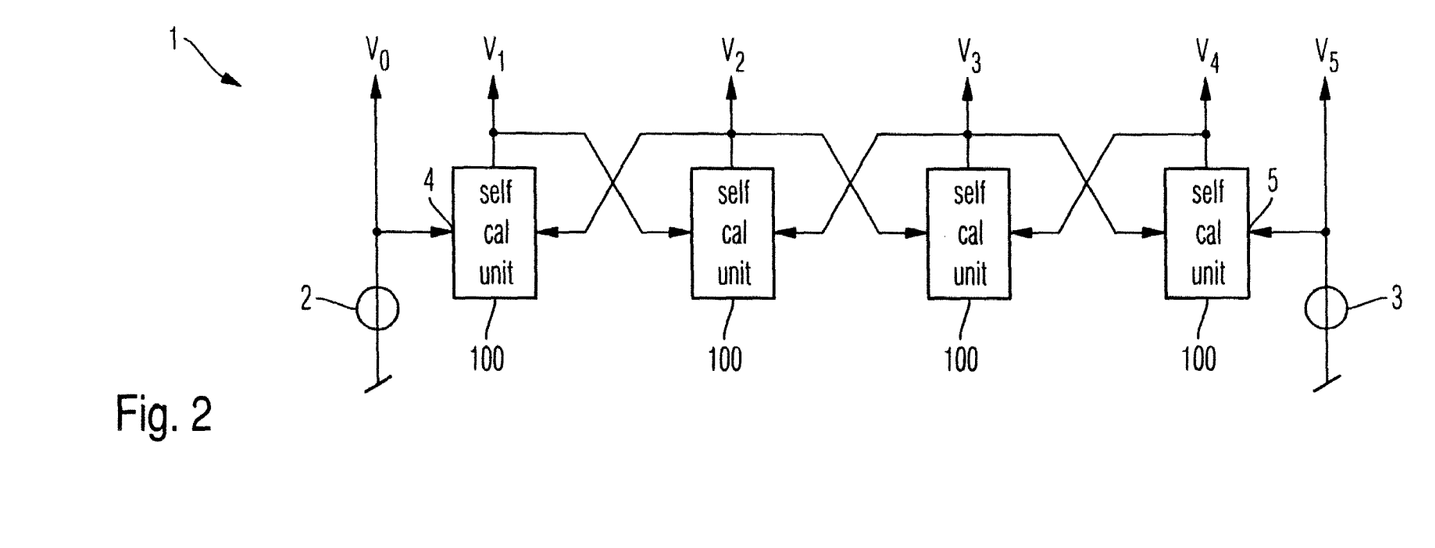
FIG. 2 shows an embodiment of the invention producing four evenly spaced reference voltages between two boundary voltages.

A block diagram of an embodiment of the invention producing a total of six linearly spaced voltages, including boundary voltages, is shown in FIG. 2. The boundary voltages $V_0$ and $V_5$ are produced by constant sources 2,3. An array of four self-calibration units 100 produces the inner four voltages $V_1$ through $V_4$. Each self-calibration unit 100 has two inputs connected to the outputs of its two nearest neighbours in the array.

At all times, each self-calibration unit 100 regulates its own output voltage toward the middle point between its two input voltages $(V_0, V_2)$, $(V_1, V_3)$, $(V_2, V_4)$, $(V_3, V_5)$. In response to a voltage change in any unit 100, the neighbours will respond by correcting their own output voltages in an attempt to re-centre it. Starting from any initial voltage pattern, the array as a whole will converge toward a state where all voltages are uniformly spaced between $V_0$ and $V_5$, in the sequence defined by the topology of the array. In mathematical terms, the self-calibration unit controlling voltage $V_k$ computes an error voltage $$E_k(t)=(V_k(t)-V_{k-1}(t))-(V_{k+1}(t)-V_k(t))=2V_k(t)-V_{k-1}(t)-V_{k+1}(t) \quad (1)$$

and permanently updates $V_k$ in such a way to reduce the error $E_k$. The simplest embodiment of a calibration unit 100 is a first-order integrator. In continuous time, the operation of a self-calibration unit 100 can thus be described by the following differential equation:

$$\frac{dV_k}{dt} = -\tau \cdot E_k(t) \quad (2)$$

where $\tau$ is the time constant of the integrator. In some embodiments, the self-calibration units 100 may operate in discrete time, in which case they update their output voltage at specific time points determined by a clock signal.

Figure 3:
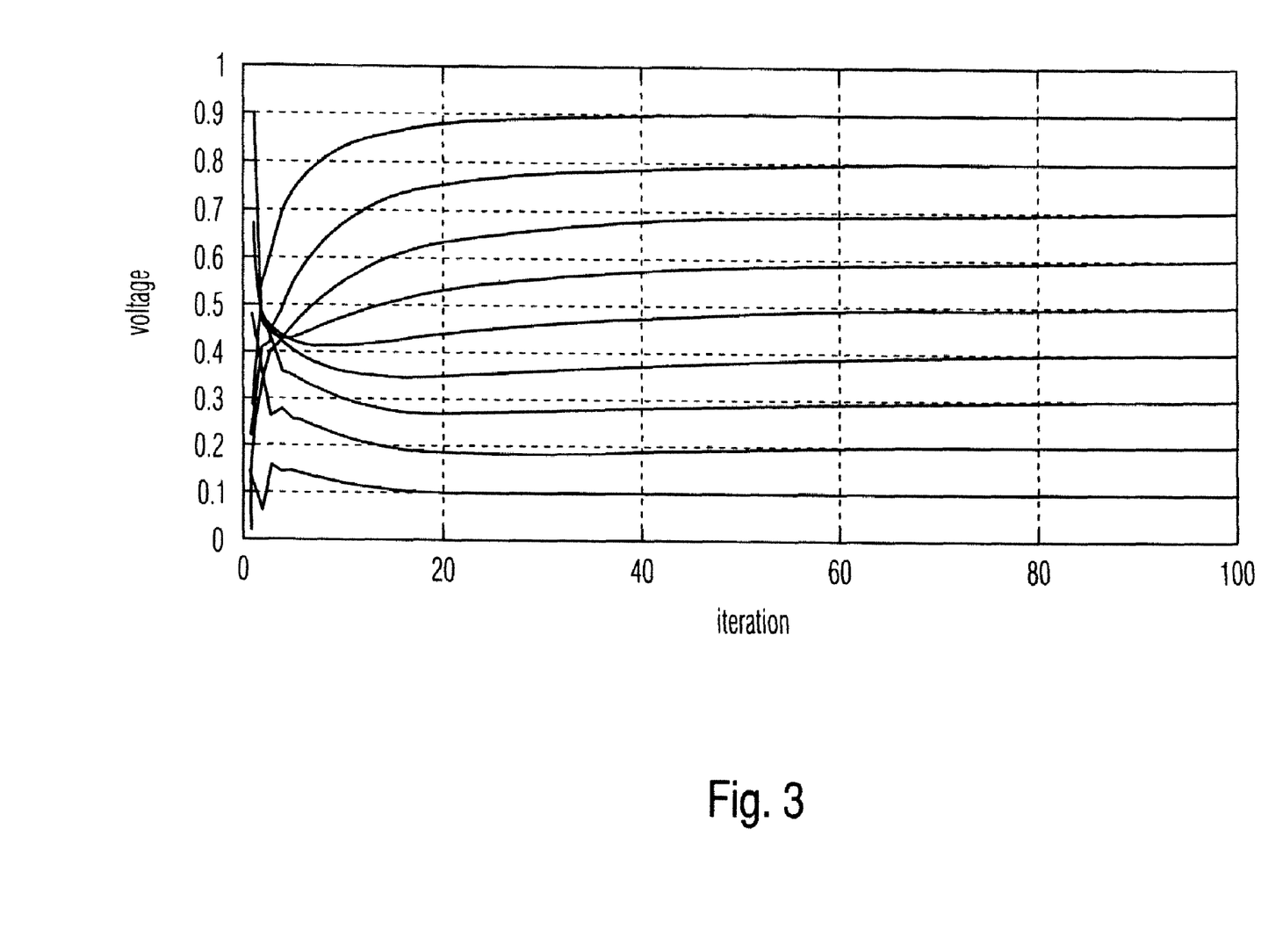
FIG. 3 shows simulated voltages versus iteration time starting from a random initial pattern.

The invention readily generalizes to arrays of any size. A discrete-time simulation in the case of an array of nine units is shown in FIG. 3.

Figure 4:
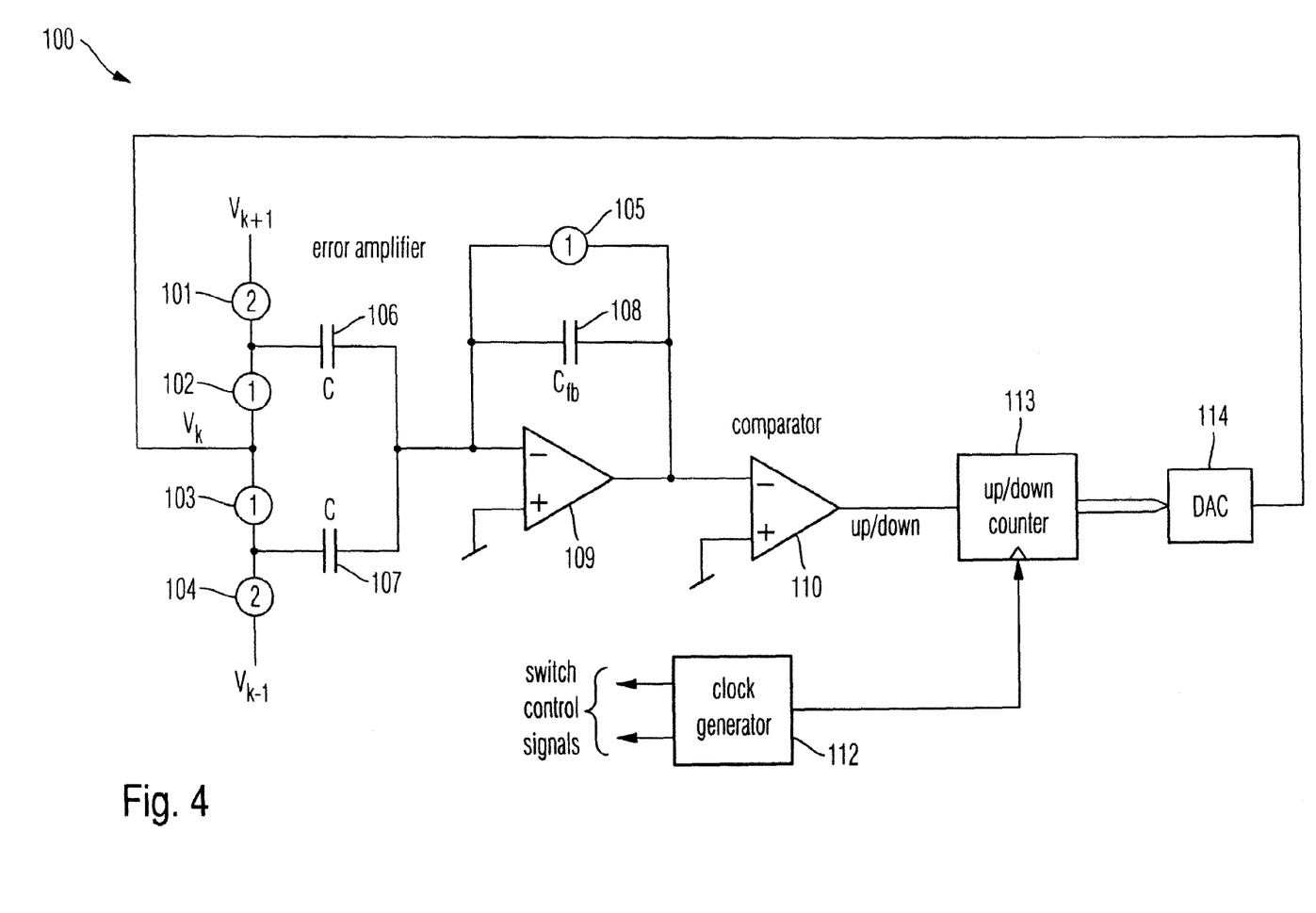
FIG. 4 shows an embodiment of a self-calibration unit based on a switched-capacitor error amplifier and a digital up/down counter serving as an integrator.

FIG. 4 shows an embodiment of the self-calibration unit 100. This circuit includes an error amplifier, comprising elements 101-109, determining the direction in which the next correction must be made, and a digital up/down counter 113 serving as an integrator. The error amplifier applies switched-capacitor techniques in order to achieve high accuracy despite the amplifier offset.

In FIG. 4, circles containing a number represent switches 101-105 controlled by the clock generator unit 112. The number indicates in which clock phase the switch is closed. In phase 1, both input capacitors 106, 107 are connected to the output node to receive the output voltage $V_k$ of this actual self-calibration unit, whereas the amplifier 109 is configured as a voltage follower. During this phase, both input capacitors 106, 107 of capacitance C are pre-charged to voltage $V_k$ minus the amplifier offset. In phase 2, the input capacitors 106, 107 are switched over to inputs $V_{k-1}$ and $V_{k+1}$. For one of the capacitors 106, this change produces a positive voltage step whereas for the other one 107, it produces a negative voltage step.

The amplifier offset remains present at its inverting input. If $V_k$ is exactly in the middle between $V_{k-1}$ and $V_{k+1}$, the net effect of both steps is exactly zero, therefore the output of the amplifier will not change. Any deviation of $V_k$ from the middle point will cause a net amount of charge to flow onto feedback capacitor $C_{fb}$. The voltage error appears at the amplifier output, magnified by the capacitance ratio $C/C_{fb}$.

A comparator 110 determines whether the error is positive or negative. The comparator output determines whether the counter 113 will increment or decrement its state at the next clock cycle. Hence, the counter output is the integral over time of the sign of the voltage error. A digital-to-analog converter (DAC) 114 turns the counter output into output voltage $V_k$. The output voltage will converge toward a limit cycle around the middle point between $V_{k+1}$ and $V_{k-1}$. The residual error can be made as small as necessary by increasing the resolution of the DAC 114. The limit cycle could be avoided by using two comparators with slightly different thresholds so that the counter neither increments, nor decrements when the residual error is very small.

The advantage of a digital integrator is that its state will remain preserved for as long as the circuit is powered up, even if the self-calibration process is stopped. By contrast, analog integrators are typically affected by leakage currents causing the output voltage to drift, unless the self-calibration process is running permanently.

As described above, the self-calibration circuit 100 relies on good matching between the two input capacitors 106, 107 of nominal value C. The circuit of FIG. 4 can be further refined in order to provide dynamic matching between these two capacitors. At the cost of a few more switches, each capacitor can be switched alternatively toward the $V_{k+1}$ input and the $V_{k-1}$ input instead of always going to the same input. On average, the circuit 100 will have the same gain for both inputs even if the two capacitors 106, 107 do not have exactly the same value.

Instead of linearly spaced voltages, it is possible to obtain logarithmically spaced voltages by a minor change in the design of the self-calibration unit 100. Instead of aiming for the middle point between $V_{k-1}$ and $V_{k+1}$, the unit can tune $V_k$ to split the interval from $V_{k-1}$ to $V_{k+1}$ in another ratio than unity. For instance, if each unit tends to make $V_{k+1}-V_k$ twice as large as $V_k-V_{k-1}$, then the collective result of an array of such units is a set of voltage differences in geometric progression with a radix of two. Unequal splitting ratios can be produced by assigning different values to the two input capacitors.

A progression with a radix of two is only one particular case. The general case includes building a self-calibration unit in such a way that they tend to produce the following relationship between node voltages:

$$\alpha \cdot (V_{k+1}-V_k)=(1-\alpha)\cdot(V_k-V_{k-1}), \ 0<\alpha<1$$

When $\alpha=\frac{1}{2}$, such a self-calibration will produce linearly spaced voltages. When $\alpha=\frac{1}{3}$, it produces voltages in a geometric progression with a radix of 2. When $\alpha=1/(1+N)$, the radix of the geometric progression is N.

The only network topology described above includes chaining self-calibration units 100 in a one-dimensional string. Other network topologies are possible, which may have somewhat different properties in terms of robustness to imperfections in the self-calibration units 100. One alternative example consists of a binary tree. One unit may take the two boundary voltages as inputs and adjust itself to produce the middle voltage of the range. Two other units may determine the middle point between one boundary voltage and the middle voltage determined by the first unit. Layer after layer of additional units could be added to find the middle points within the set of voltages produced by the previous layer. This topology may offer better integral non-linearity in the presence of imbalance within the self-calibration units, possibly at the cost of some degradation in differential non-linearity.

Subsequently, a more detailed description of the self-calibration unit in FIG. 4 is provided. A clock generator 112 provides at its output a clock signal which is provided to switches 101, 102, 103, 104, and 105 as well as to the input of an up/down counter 113. In a first phase of the clock signal the switches 102, 103 and 105 are closed. In a second phase of the clock signal the switches 101 and 104 are closed.

In a first phase, the voltage $V_k$ which is provided from the output of a digital-analog-converter 114 is fed via switches 102 and 103 to the first input terminals of capacitors 106 and 107 which have a first and a second capacitance C whereby switches 102 and 103 are closed. Second terminals of capacitors 106 and 107 are connected to a negative input port of feedback voltage supplying amplifier 109. The positive input port of the feedback voltage supplying amplifier 109 is connected to earth potential.

The voltage $V_k$, which is provided from the output of the digital-analog-converter 114, charges the first and the second capacitor 106 and 107. In the first phase the switch 105 is also closed and short-circuits a feedback capacitor 108 which has a capacitance of $C_{fb}$.

In a second phase the switches 102 and 103 are open and the switches 101 and 104 are closed. In this phase the voltage $V_{k-1}$ is connected via a switch 104 to the first input port of the second capacitor 107 and the voltage $V_{k+1}$ is connected via a switch 101 to the first input port of the first capacitor 106. The second terminals of capacitors 106 and 107 are connected to the first input port of the feedback capacitor 108 and the negative input port (−) of the feedback voltage supplying amplifier 109. The second terminal of the feedback capacitor 108 is connected to the negative input port (−) of the comparator 110. The positive input port (+) of the comparator 110 is connected to earth potential. In the second phase the switch 105 is open and, hence, feedback capacitor 108 is charged.

The voltage step from $V_k$ to $V_{k+1}$ at the first input port of capacitor 106 that happens when the capacitor charged in a first phase to voltage $V_k$ is then switched in a second phase to $V_{k+1}$ and introduces a first current in a first direction via first capacitor 106 and feedback capacitor 108. Conversely, the voltage step from $V_k$ to $V_{k-1}$ at the first input port of capacitor 107 that happens when the capacitor charged in a first phase to voltage $V_k$ is then switched in a second phase to $V_{k-1}$ introduces a second current in a second direction via second capacitor 107 and feedback capacitor 108.

If the voltage $V_k$ in the first phase is exactly the arithmetic mean of the voltages $V_{k+1}$ and $V_{k-1}$ that are connected to the first input terminal of the first capacitor 106 and the first terminal of the second capacitor 107, respectively, the net current over the feedback capacitor 108 is zero. If the voltage $V_k$ in the first phase was not exactly the arithmetic mean of the voltages $V_{k+1}$ and $V_{k-1}$ that are connected to the first input terminal of the first capacitor 106 and the first terminal of the second capacitor 107, respectively, the net current over the feedback capacitor 108 is not zero and the feedback capacitor 108 is charged. The charge of the feedback capacitor 108 is calculated as a difference voltage from the voltages $V_{k+1}$, $V_{k-1}$, and $V_k$ and is a weighted average of the ratio of the capacitance of the first capacitor 106 and the feedback capacitor 108 and the capacitance of the second capacitor 107 and the feedback capacitor 108.

The charge of the feedback capacitor 108 provides an error voltage to the negative input port of the comparator 110. If the error voltage exceeds a preset positive voltage the comparator 110 will provide an up signal. If the error voltage exceeds a preset negative voltage the comparator 110 will provide a down signal.

The up or down signal of the comparator 110 is provided to the input port of the up/down counter 113. The up/down counter 113 increments or decrements an internal count depending if an up signal or a down signal is provided at its input. The count of the up/down counter 113 is provided at its output to the input of the digital-analog-converter 114, which converts the count of the up/down counter 113 to a voltage signal at its output port. The output of the digital-analog-converter 114 will provide the voltage $V_k$ via the switches 102 and 103 to the first input terminals of the capacitors 106 and 107 and will charge the capacitors 106 and 107 in the first phase of the clock signal provided by the clock generator 112.

Figure 5:
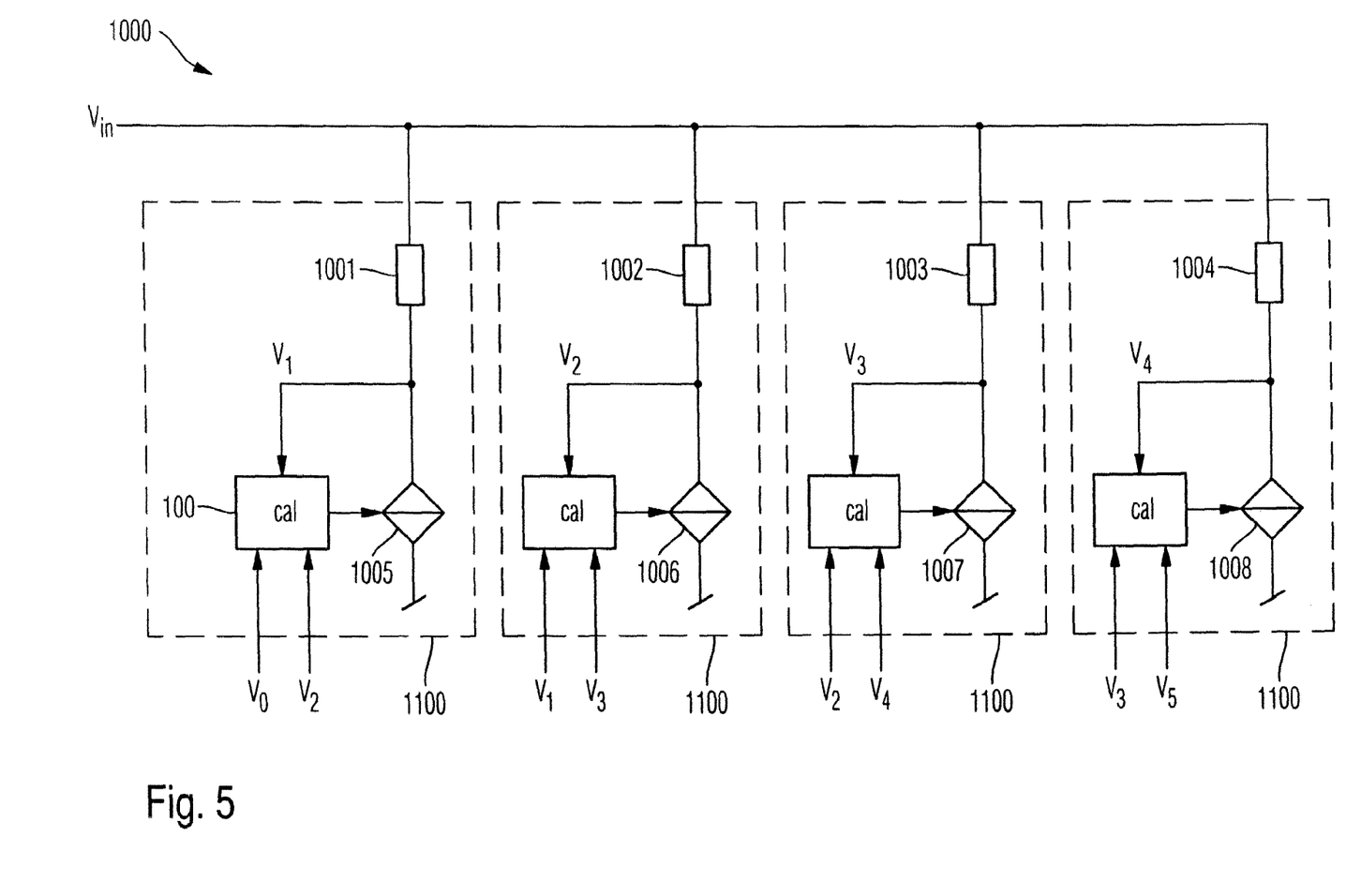
FIG. 5 shows another embodiment of the invention producing four evenly spaced reference voltages between two boundary voltages.

As shown in FIG. 5, the invention is of particular interest in the case where each self-calibration unit 100 produces a voltage across an output resistor 1001-1004 connected to a common node. In this case, an input signal can be applied to the common node, whereby each output of the array tracks the input signal $V_{in}$ with a constant offset, the offsets being linearly distributed over some range. Given that all outputs of the array track the same input signal simultaneously, voltage differences between array outputs are independent of the input signal. The self-calibration algorithm as described above will still produce the same result as if the common node was held at a constant voltage.

This variation is of particular interest because this structure is the basis of a particularly advantageous fully differential high-speed ADC front-end architecture as described in European Patent Application EP 05 019 801.9, which is incorporated into this application by reference. In this circuit, the signal paths from the common input to all output nodes $V_0$-$V_5$ of the array have the same series impedance and loading conditions, which ensures that the bandwidth and propagation delays match between them. Resistor chains from the prior art can also be made to track an input signal, but in this case, the impedances vary widely between output taps $V_0$-$V_5$.

Subsequently, a second embodiment for producing a set of linearly spaced voltages is described. In this embodiment several resistors 1001-1004 are connected with their first port to a common node to which a voltage $V_{in}$ can be connected. Current sources 1005-1008 are connected with their first port to the second port of resistors 1001-1004 and with their second port to earth potential. Current sources 1005-1008 are current sources with a third port for controlling their output current.

Also in this embodiment, the self-calibration units 100 receive input voltages at three ports. At a second port the self-calibration units 100 receive the voltage potentials $V_1$-$V_4$ that can be tapped at the second ports of resistors 1001-1004. At a first port the self-calibration units 100 receive the voltages $V_1$-$V_3$ or a reference voltage $V_0$ in case of the left-most unit in FIG. 5. At a third port the self-calibration units 100 receive the voltages $V_2$-$V_4$ or a reference voltage $V_5$ in case of the right-most unit in FIG. 5.

Figure 6:
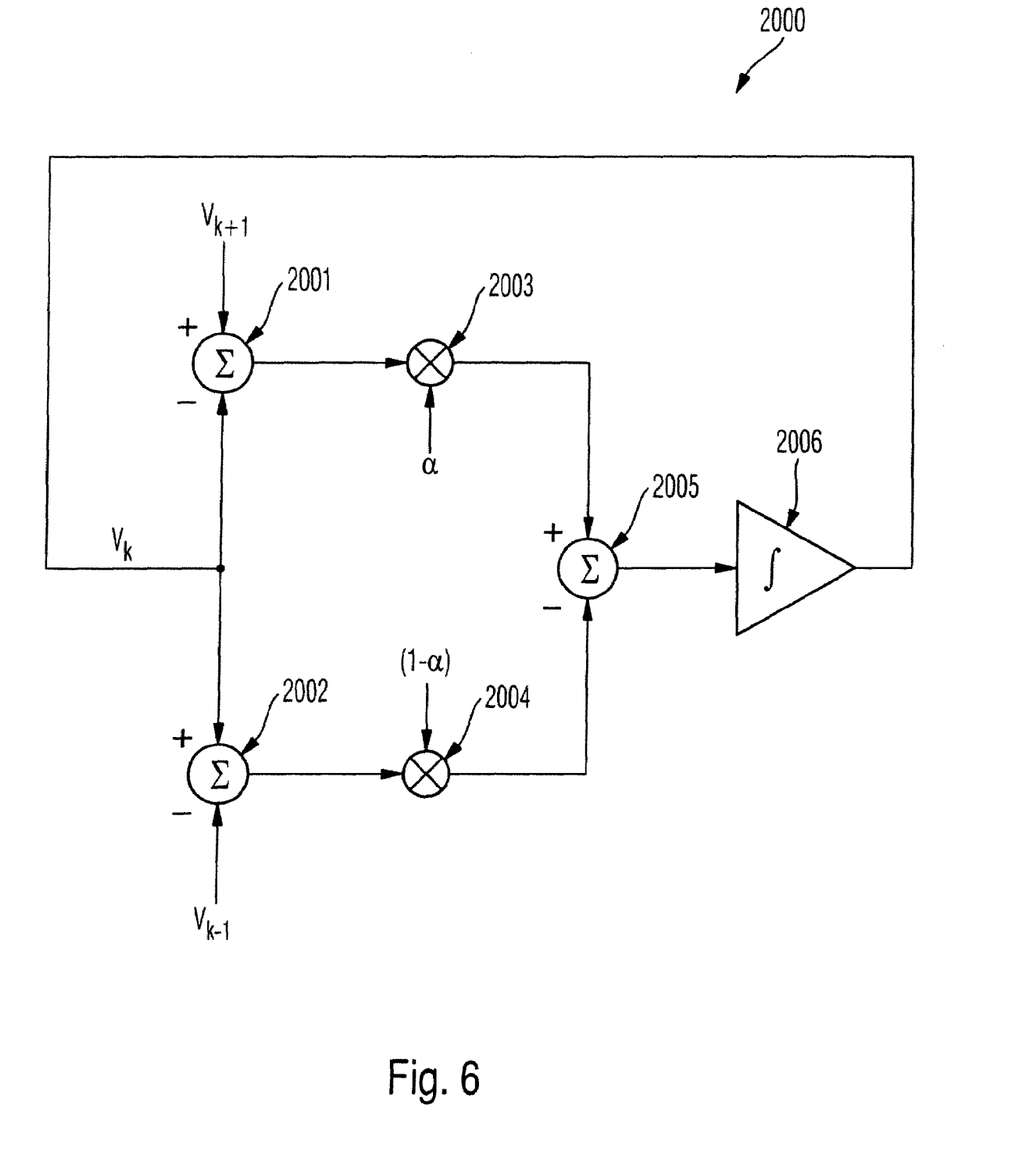
FIG. 6 shows another embodiment of a self-calibration unit.

FIG. 6 shows another embodiment of the self-calibration unit 2000. This embodiment comprises two summations 2001 and 2002, two multiplier 2003 and 2004, another summation 2005 and an integrator 2006. An output voltage $V_k$ is summed with input voltages $V_{k+1}$ and $V_{k-1}$ so that the difference voltages $V_{k+1}-V_k$ and $V_k-V_{k-1}$ are obtained. These differences are scaled with factors $\alpha$ and $1-\alpha$ so that the scaled differences $\alpha \cdot (V_{k+1}-V_k)$ and $(1-\alpha) \cdot (V_k-V_{k-1})$ are obtained. These scaled differences are again summed and the error $E_k(t)=(1-\alpha) \cdot (V_k-V_{k-1})-\alpha \cdot (V_{k+1}-V_k)$ is obtained which is integrated to the output voltage $V_k$.

The advantages of the previously described invention may be summarized as follows.

The accuracy of the set of voltages generated according to the invention can be higher than the accuracy achievable with resistor chains, because the self-calibration units 100 can be designed to rely on dynamic comparisons rather than static element matching.

Input bias currents possibly drawn by comparators loading the outputs do not distort the distribution of reference voltages produced by the invention, in contrast to resistor chains.

All voltage outputs are driven with the same impedance, which ensures identical bandwidths and propagation delays in variations where an input signal is tracked.

The invention is suitable as a self-calibration scheme for an ADC front-end circuit disclosed in EP 05 019 801.9.

The invention is not restricted to the above embodiments and can be used with different implementations. The current sources and the input stages of the differential amplifiers can be implemented in bipolar technology but also in CMOS technology. The current sources can be configured as current mirror circuits. All features described in this description and shown in the accompanying drawings can be combined.

The invention claimed is:

1. A circuit for generating a set of intermediate voltages between two reference voltages, said circuit comprising two input ports for feeding two reference voltages, wherein the intermediate voltages are generated by a number of self calibration units that correspond to the number of intermediate voltages to be generated, wherein each self calibration unit receives the voltages of the neighboring calibration units or the voltage of one neighboring calibration unit and one of the reference voltages, and wherein each self calibration unit comprises:

an error amplifier for providing an error voltage, a comparator for providing an up/down signal when the error voltage exceeds a positive or a negative voltage level, an up/down counter working as an integrator and counting an internal count one up or one down depending on the up/down signal received from the comparator, a digital-analog-converter for converting the digital signal received from the up/down counter into an analog signal, and a clock signal generator for providing clock signals for the error amplifier and the up/down counter.

2. The circuit for generating a set of intermediate voltages according to claim 1, wherein self-calibration unit comprises summations, multiplications and an integration, wherein an error voltage $E_k(t)$ is integrated to an output voltage $V_k$.

3. The circuit for generating a set of intermediate voltages according to claim 1, wherein the error amplifier comprises:

a first capacitor which receives an output voltage $V_k$ of the actual self-calibration unit via a first switch and receives the output voltage $V_{k-1}$ of a first neighboring self-calibration unit via a second switch, a second capacitor which receives an output voltage $V_k$ of the self-calibration unit via a third switch and the output voltage $V_{k+1}$ of a second neighboring self-calibration unit via a fourth switch, an operational amplifier wherein the first and the second capacitor are connected to its negative input port (−) and its positive input port (+) is connected to earth potential, and a feedback capacitor which is connected to one terminal to the negative input port (−) of the operational amplifier and with the other terminal to the output port of the operational amplifier.

4. The circuit for generating a set of intermediate voltages according to claim 3, wherein each capacitor can be switched alternatively to the output voltage $V_k$ of the actual self-calibration unit or to the output voltage $V_{k+1}$ or $V_{k-1}$ of one of the neighboring self-calibration units.

5. The circuit for generating a set of intermediate voltages according to claim 3, wherein each self-calibration unit regulates $V_{k+1}-V_k$ equal to $V_k-V_{k-1}$ or twice as large as $V_k-V_{k-1}$.

6. The circuit for generating a set of intermediate voltages according to claim 1, wherein the output voltages of the self-calibration units are logarithmically spaced.

7. The circuit for generating a set of intermediate voltages according to claim 1, wherein the self-calibration units are chained to a binary tree, wherein in a first layer one unit receives two boundary voltages as inputs and produces a middle voltage and two other units determine the middle point between one boundary voltage and the middle voltage and the middle voltage between the middle voltage and the other boundary voltage, and wherein the set of voltages is fed to a second layer of self-calibration units that binary refine the set of voltages obtained from the first layer of self-calibration units and further binary refinement is achieved by feeding the set of voltages of a previous layer of self-calibration units to a subsequent layer of self-calibration units by determining the middle voltages of the set of voltages generated by the self-calibration units of the previous layer.

8. The circuit for generating a set of intermediate voltages according to claim 2, wherein the error voltage $E_k(t)$ is calculated according to the equation:

$$E_k(t)=\alpha \cdot (V_{k+1}(t)-V_k(t))-(1-\alpha) \cdot (V_k(t)-V_{k-1}(t)).$$

9. The circuit for generating a set of intermediate voltages according to claim 2, wherein the error voltage $E_k(t)$ is calculated from the voltage differences $V_{k+1}-V_k$ and $V_k-V_{k-1}$ through scaling with the factors $\alpha$ and $1-\alpha$, $\alpha \in \{0,1\} \Re$, and is integrated with an integrator of the type:

$$\frac{dV_k}{dt} = -\tau \cdot E_k(t),$$

where $\tau$ is a time constant.

10. A circuit for generating a set of intermediate voltages between two reference voltages, said circuit comprising two input ports for feeding two reference voltages, wherein the intermediate voltages are generated by a number of self calibration units that correspond to the number of intermediate voltages to be generated, wherein each self calibration unit receives the voltages of the neighboring calibration units or the voltage of one neighboring calibration unit and one of the reference voltages, wherein the self-calibration units are chained to a binary tree, wherein in a first layer one unit receives two boundary voltages as inputs and produces a middle voltage and two other units determine the middle point between one boundary voltage and the middle voltage and the middle voltage between the middle voltage and the other boundary voltage, and wherein the set of voltages is fed to a second layer of self-calibration units that binary refine the set of voltages obtained from the first layer of self-calibration units and further binary refinement is achieved by feeding the set of voltages of a previous layer of self-calibration units to a subsequent layer of self-calibration unit by determining the middle voltages of the set of voltages generated by the self-calibration unit of the previous layer.

11. A method for generating a set of intermediate voltages with a circuit for generating a set of intermediate voltages between two reference voltages, said circuit comprising two input ports for feeding two reference voltages, wherein the intermediate voltages are generated by a number of self-calibration units that correspond to the number of intermediate voltages to be generated, wherein each self-calibration unit receives the voltages of the neighboring calibration units or the voltage of one neighboring calibration unit and one of the reference voltages, and wherein each self calibration unit comprises:
an error amplifier for providing an error voltage,
a comparator for providing an up/down signal when the error voltage exceeds a positive or a negative voltage level,
an up/down counter working as an integrator and counting an internal count one up or one down depending on the up/down signal received from the comparator,
a digital-analog-converter for converting the digital signal received from the up/down counter into an analog signal, and
a clock signal generator for providing clock signals for the error amplifier and the up/down counter,
said method comprising:
feeding two reference voltages to two input ports of a number of self-calibration units, and
generating a number of intermediate voltages by the number of self-calibration units by feeding the voltages of the neighboring calibration units or the voltage of one neighboring calibration unit and one of the reference voltages.

12. A method for generating a set of intermediate voltages according to claim 11,
wherein the error amplifier comprises:
a first capacitor which receives an output voltage $V_k$ of the actual self-calibration unit via a first switch and receives the output voltage $V_{k-1}$ of a first neighboring self-calibration unit via a second switch,
a second capacitor which receives an output voltage $V_k$ of the self-calibration unit via a third switch and the output voltage $V_{k+1}$ of a second neighboring self-calibration unit via a fourth switch,
an operational amplifier wherein the first and the second capacitor are connected to its negative input port (−) and its positive input port (+) is connected to earth potential, and
a feedback capacitor which is connected to one terminal to the negative input port (−) of the operational amplifier and with the other terminal to the output port of the operational amplifier,
said method comprising:
charging the first and the second capacitor with a voltage of the actual self-calibration unit by closing the first and the third switch during a first cycle of the switch control signals, and
applying a first neighboring voltage to the first capacitor by closing the second switch and applying a second neighboring voltage to the second capacitor by closing the fourth switch during a second cycle of the switch control signals.

13. The method according to claim 12 further comprising:
charging the feedback capacitor with an error current, that occurs due to a deviation of the voltage of the actual self-calibration unit from the arithmetic mean of the neighboring voltages of the neighboring self-calibration units by opening a fifth switch arranged in parallel to the feedback capacitor,
converting the accumulated error charge on the third capacitor to the comparator for generating an up/down signal,
incrementing or decrementing a up/down counter according to the up/down signal for providing a digital signal, and
converting the digital signal to an analog voltage by feeding the digital signal into the digital-to-analog converter.

14. The method according to claim 11 further comprising:
calculating an error voltage $E_k(t)$ using summations, multiplications and an integration; and
integrating the error voltage $E_k(t)$ to an output voltage $V_k$.

15. The method for generating a set of intermediate voltages according to claim 14, comprising calculating
the error voltage $E_k(t)$ from the voltage differences $V_{k+1}-V_k$ and $V_k-V_{k-1}$ through scaling with the factors $\alpha$ and $1-\alpha$, $\alpha \in \{0,1\} \Re$, and is integrated with an integrator of the type:

$$\frac{dV_k}{dt} = -\tau \cdot E_k(t),$$

where $\tau$ is a time constant.

16. The method for generating a set of intermediate voltages according to claim 14, comprising calculating
the error voltage $E_k(t)$ according to the equation:

$$E_k(t)=\alpha \cdot (V_{k+1}(t)-V_k(t))-(1-\alpha)\cdot(V_k(t)-V_{k-1}(t)).$$

17. A circuit for generating a set of intermediate voltages between two reference voltages, said circuit comprising two input ports for feeding two reference voltages, wherein the intermediate voltages are generated by a number of self calibration units that correspond to the number of intermediate voltages to be generated, wherein each self calibration unit receives the voltages of the neighboring calibration units or the voltage of one neighboring calibration unit and one of the reference voltages, wherein a self-calibration unit comprises summations, multiplications and an integration, wherein an error voltage $E_k(t)$ is integrated to an output voltage Vk.

18. The circuit for generating a set of intermediate voltages according to claim 17, wherein the error voltage $E_k(t)$ is calculated according to the equation:

$$E_k(t)=\alpha \cdot (V_{k+1}(t)-V_k(t))-(1-\alpha)\cdot(V_k(t)-V_{k-1}(t)).$$

19. The circuit for generating a set of intermediate voltages according to claim 17, wherein the error voltage $E_k(t)$ is calculated from the voltage differences $V_{k+1}-V_k$ and $V_k-V_{k-1}$ through scaling with the factors $\alpha$ and $1-\alpha$, $\alpha \in \{0,1\} \Re$, and is integrated with an integrator of the type:

$$\frac{dV_k}{dt} = -\tau \cdot E_k(t),$$

where $\tau$ is a time constant.

20. A method for generating a set of intermediate voltages with a circuit for generating a set of intermediate voltages between two reference voltages, said circuit comprising two input ports for feeding two reference voltages, wherein the intermediate voltages are generated by a number of self-calibration units that correspond to the number of intermediate voltage to be generated, wherein each self-calibration unit receives the voltage of the neighboring calibration units or the voltage of one neighboring calibration unit and one of the reference voltages, and further comprising calculating an error voltage Ek(t) using summations, multiplications and an integration; and integrating the error voltage $E_k(t)$ to an output voltage Vk.

21. The method for generating a set of intermediate voltages according to claim 20, comprising calculating the error voltage $E_k(t)$ according to the equation:

$$E_k(t) = \alpha \cdot (V_{k+1}(t) - V_k(t)) - (1-\alpha) \cdot (V_k(t) - V_{k-1}(t)).$$

22. The method for generating a set of intermediate voltages according to claim 20, comprising calculating the error voltage $E_k(t)$ from the voltage differences $V_{k+1} - V_k$ and $V_k - V_{k-1}$ through scaling with the factors $\alpha$ and $1-\alpha$, $\alpha \in \{0,1\} \Re$, and is integrated with an integrator of the type:

$$\frac{dV_k}{dt} = -\tau \cdot E_k(t),$$

where $\tau$ is a time constant.

* * * * *